United States Patent [19]

Schneider

[11] Patent Number: 5,216,554
[45] Date of Patent: Jun. 1, 1993

[54] DIGITAL PHASE ERROR ESTIMATOR

[75] Inventor: Richard C. Schneider, Tucson, Ariz.

[73] Assignee: International Business Machines Corporation, Armonk, N.Y.

[21] Appl. No.: 724,296

[22] Filed: Jul. 1, 1991

[51] Int. Cl.$^5$ ............................ G11B 5/09; H03L 7/00
[52] U.S. Cl. ...................................... 360/51; 331/1 A; 375/120
[58] Field of Search ............... 360/51, 48, 32, 52, 360/22; 331/1 A, 17, 11, 12, 14, 18, 23, 25, 27, 30; 375/120, 86, 97, 119; 328/155

[56] References Cited

U.S. PATENT DOCUMENTS

| | | | |
|---|---|---|---|
| 4,577,240 | 3/1986 | Hedberg et al. | 360/22 |
| 4,633,193 | 12/1986 | Scordo | 331/1 A |
| 4,633,488 | 12/1986 | Shaw | 331/1 A X |
| 4,724,495 | 2/1988 | Hedberg et al. | 360/48 X |
| 4,744,096 | 5/1988 | Roux | 375/120 |
| 4,862,104 | 8/1989 | Muratani et al. | 331/1 A |
| 4,871,975 | 10/1989 | Nawata et al. | 331/12 X |

OTHER PUBLICATIONS

F. Dolivo, W. Schott, and G. Ungerbock, "Fast Timing Recovery for Partial-Response Signaling System," IEEE Int. Conf. on Comm., Jun. 1989 pp. 573–577.

F. Dolivo, "Signal Processing for High-Density Digital Magnetic Recording," IEEE 5th Annual European Comp. Conf., May, 1989, pp. 91–96.

Primary Examiner—Robert J. Pascal
Assistant Examiner—Ali Neyzari
Attorney, Agent, or Firm—F. E. Anderson; M. W. Schecter

[57] ABSTRACT

A data clock is synchronized to a modulation coded signal read from a moving storage medium by a phase error estimator circuit that samples the modulation coded signal two times on each side of a detected peak. A first detected data bit taken at a time $N-2$ (two time periods prior to the detected peak) is used to predict the expected value of a first modulation coded signal sample taken at a time $N-1$ (one time period prior to the detected peak). Similarly, a second detected data bit taken at a time $N+2$ is used to predict the expected value of a second modulation coded signal sample taken at a time $N+1$. Because the first and second detected data bits are able to predict the first and second samples, respectively, the phase error estimator circuit is able to accurately detect phase errors when sampling arbitrary data as would be presented by a (1,k) modulation coded signal. The expected values at times $N-1$ and $N+1$ are compared to the actual values and error voltages are determined therefrom. The error voltages are multiplied by the appropriate slope factors, also determined by the first and second detected data bits, and error estimates $E(N-1)$ and $E(N+1)$ are provided. $E(N-1)$ is added to $E(N+1)$ to provide the phase error estimate $E(N)$.

20 Claims, 3 Drawing Sheets

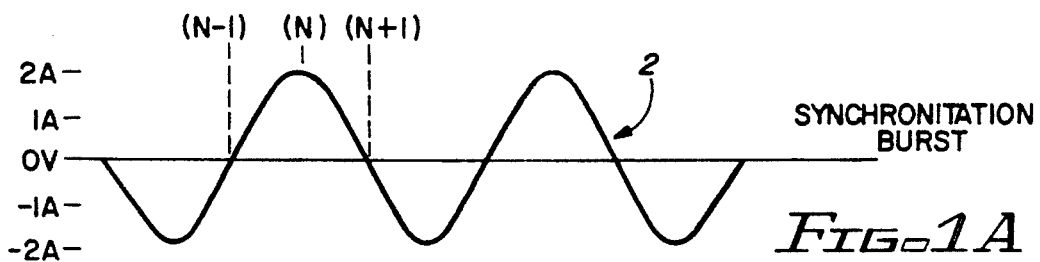
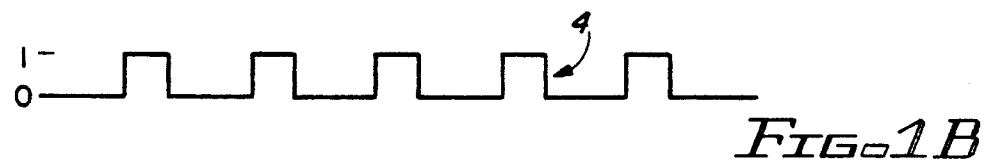
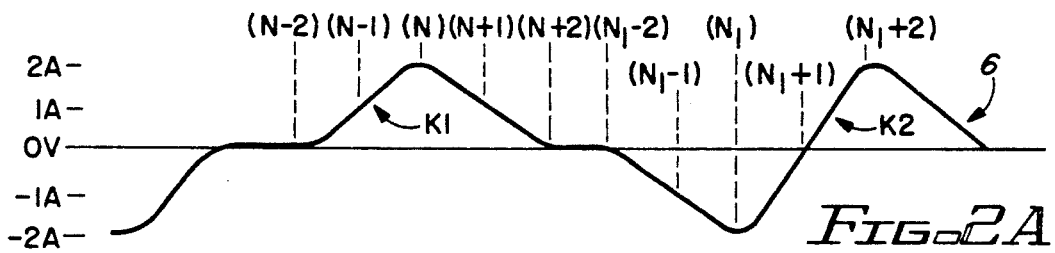
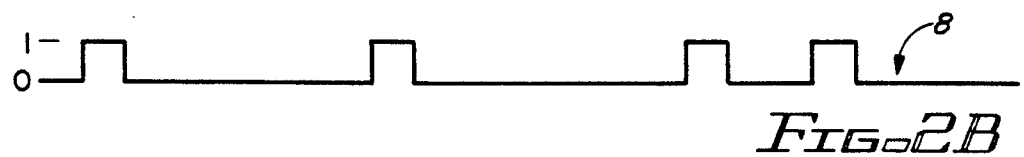
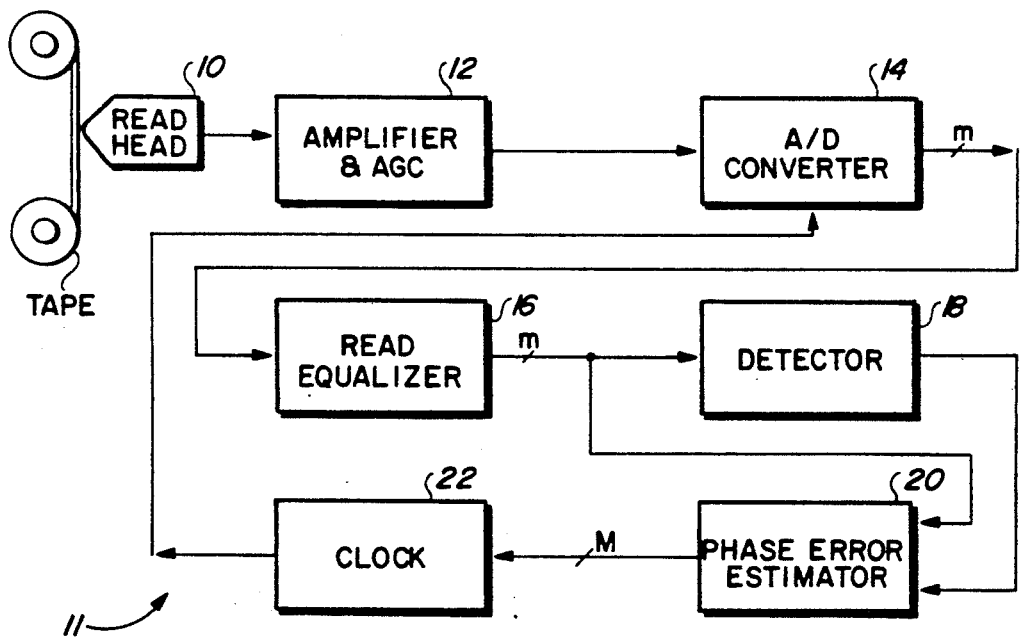

DIGITAL PHASE ERROR ESTIMATOR

FIELD OF THE INVENTION

This invention relates generally to the field of phase error correction methods and more particularly, to a digital phase error estimator for synchronizing data read from a storage medium to a data clock.

BACKGROUND OF THE INVENTION

Data processing systems rely upon stored information for processing data and performing applications that the data processing systems are required to perform. The stored information can include an application program which instructs the data processing system, for example, on how to manipulate data, or the information can be the data itself. In any event, in all but the smallest applications, it is usually necessary to move the information from a storage medium to the data processing system's internal memory before processing can proceed. There exists many different forms of storage media for storing the information needed in the data processing systems.

Three typical forms of storage media include magnetic disks, optical disks and magnetic tape. A common form of magnetic disk storage media is direct access storage devices (DASD). DASD offers high storage capacity while providing relatively fast access to the information stored thereon. Optical disks are capable of storing larger amounts of information than DASD but require more time to access the stored information. Magnetic tape presently has the ability to store the largest amount of information but data access is much slower than DASD or optical disks. Magnetic tape's combination of high storage capacity, slow access speed, and low cost make it well suited for information back-up purposes.

Regardless of the storage medium used, the stored information must be read therefrom and converted into a form the data processing system can recognize. In the case of DASD and optical storage media, the information is stored on rigid discs that spin at a given speed while a read head, stationed just above storage medium, recognizes the bits of 1's and 0's that make up the stored information and converts them into electrical signals. Magnetic tape is typically stored on a reel or cartridge and the tape is forced to travel across a tape read head at a given speed while the tape read head detects the information stored on the tape as it passes by the read head. When very large amounts of information are required to be retrieved from the storage medium, the time required to access that information is an important factor. The access time is a function of the speed at which the storage medium travels past the read head. However, increasing the storage medium speed generally results in increased read errors.

A common read error problem occurs as a result of time domain failures. Each bit of information read from the storage medium must occur within a specified time window. If the position of the storage medium, for a given bit, is outside the expected time window, the data processing system will be receiving erroneous information. Hence, it is vital that the storage medium be synchronized to a data clock. Synchronization requires that the data clock be adjusted frequently by estimating a phase error between the bits of information read from the storage medium and the data clock. The phase error estimate is then used to adjust the data clock.

Numerous other signal applications require that phase adjustments be made between a first fixed signal and a second signal subject to drifting from the timing of the first fixed signal (i.e., phase changes between the two signals). For example, Muratani, et al., in U.S. Pat. No. 4,862,104, describe a system for receiving a first information signal having a carrier that is compared to both a first carrier of a fixed oscillator and a second carrier of the fixed oscillator which is orthogonal to the first carrier for determining phase and frequency errors. Scordo, in U.S. Pat. No. 4,633,193, describes a system for synchronizing a local timing signal to a reference timing signal. The local and reference timing signal frequencies are estimated by comparing each to a fixed oscillator signal. Another common application requiring phase estimation includes recovering clock timing from a transmitted signal. Roux teaches a clock recovery circuit in U.S. Pat. No. 4,744,096 which relies on an in-phase and a quadrature phase received signal for recovering clock timing. Roux's clock recovery circuit includes sampling the received signals, converting the samples to digital samples, and determining a phase error therefrom.

A method for adjusting sample-timing phase in storage systems, including samples taken from magnetic tape, is described in "Fast Timing Recovery For Partial-Response Signaling Systems," F. Dolivo, W. Schott, and G. Ungerbock, IEEE International Conference on Communications, June 1989, pp. 573-577. The described method uses a hysteresis effect to reduce the length of a synchronization burst required for initially synchronizing the data samples to a data clock. The hysteresis effect is provided by using past data-signal estimates for setting present decision threshold levels.

Several methods of writing data to a storage medium are available. For example, the data may be encoded according to many well known methods. The ability to accurately read data from a magnetic storage medium is affected by the method chosen for writing the data to the storage medium. Information stored on magnetic tape, for example, may be modulation coded to improve the accuracy of reading the data from the magnetic tape. A (l,k) modulation code describes a data format requiring that each binary 1 be followed by at least one but not more than k binary 0's. Therefore, a (1,1) modulation code would consist of alternating binary 1's and 0's. Furthermore, it is common to require that every other peak representing a binary 1 have opposite polarities. A (1,1) modulation code is often used as a synchronization burst for initially synchronizing the storage medium and the data clock. The synchronization burst works well given its predictability.

A prior method of synchronizing data read from magnetic tape to a data clock includes sampling the data on each clock cycle and storing three successive samples. When a peak is detected, the samples on each side of the peak are compared to expected values of the modulated data that would exist given perfect synchronization, i.e., ideal values. Based on the slope of the modulation code at the sampled times and the differences in magnitudes, a phase error can be estimated and the data clock can be adjusted accordingly. While this method is satisfactory for a synchronization burst having a known data pattern, it is less effective when the data patterns are arbitrary such as would occur, for example, in a (1,7) modulation code. When a data pattern is arbitrary, the slope may change depending upon whether more than one binary 1 follow a binary 0. Using an incorrect slope in the calculation of a phase error, of course, leads to an erroneous result since the ideal values could not be known. A more accurate determination of the slope requires that additional data be considered on each side of a detected peak.

Thus, what is needed is a phase error estimator for synchronizing data read from a storage medium to a data clock that uses data information from two time periods on each side of a detected peak which makes possible an accurate determination of the respective slopes and ideal magnitudes of a modulation code for accurate phase error estimation in arbitrary data patterns.

SUMMARY OF THE INVENTION

Accordingly, it is an object of the present invention to provide an improved method of synchronizing data pulses to a data clock.

Another object of the present invention is to provide an improved method of estimating the phase error between a detected peak and a data clock.

Yet another object of the present invention is to provide an improved digital phase error estimator.

Still another object of the present invention is to provide a digital phase error estimator having slope correction for normalizing a detected phase error.

These and other objects of this invention are accomplished by an apparatus for estimating a phase error between data pulses and a data clock wherein the data pulses are a portion of a (l,k) modulation code. Each data pulse of the (l,k) modulation code is followed by at least a single logical 0 and alternating data pulses have opposite polarities. The modulation code is typically sequentially read from a storage medium as it passes by a read head and must be synchronized to the data clock. A detector circuit is coupled to the read head for receiving samples of the modulation code and detecting a peak therefrom by comparing each sample of the modulation code to a threshold voltage. The magnitude of the sample must be greater than the magnitude of the threshold voltage to register as a peak. If a peak has been detected, the detector circuit determines the polarity of the detected peak by considering the polarity of the threshold level that the peak has exceeded. In addition, for phase-estimation purposes, two other samples of the signal amplitude are made. A first sample is taken one time period prior to the detected peak, and second a sample is taken one time period after the detected peak. Each of these two samples is taken relative to the data clock.

A phase error estimator circuit is coupled to the detector circuit for determining a phase error between the detected peak and the data clock by summing a first estimated error to a second estimated error. The first estimated error is determined by calculating a difference between a first expected voltage and the first sample. The first expected voltage is the ideal magnitude of the modulation code at one time period prior to the detected peak. The first estimated error is also polarity compensated to match the polarity of the detected peak and is further multiplied by a first slope factor. The first slope factor is a function of whether the data two time periods prior to the detected peak is a logical 0 or a logical 1. The second estimated error is similarly determined by calculating a difference between a second expected voltage and the second sample. The second expected voltage is the ideal magnitude of the modulation code at one time period after the detected peak. The second estimated error is polarity compensated to match the polarity of the detected peak and is further multiplied by a second slope factor. The second slope factor is a function of whether the data two time periods following the detected peak is a logical 0 or a logical 1.

The apparatus for estimating phase errors is able to accurately determine phase errors for modulation codes having arbitrary data patterns. This is possible because the data bits of the modulation coded data two time periods before a detected peak and two time periods following a detected peak are considered. These data bits provide the information necessary to determine the expected magnitude of the modulation code one time period proceeding and one time period following the modulation code so that an accurate comparison can be made with the measured values of the modulation code at those times and a phase error estimated therefrom. The slope of the modulation code proceeding and following each detected peak can also be determined for normalizing the detected error.

The foregoing and other objects, features and advantages of the invention will be apparent from the following more particular description of the preferred embodiment of the invention, as illustrated in the accompanying drawing.

BRIEF DESCRIPTION OF THE DRAWING

FIG. 1A is a waveform diagram of a synchronization burst having a (1,1) modulation code format with a plurality of sample times indicated for use in a Stochastic-Gradient algorithm.

FIG. 1B is a digital waveform diagram of the binary data derived from the waveform diagram of FIG. 1A.

FIG. 2A is a waveform diagram of a data pulse stream having a (l,k) modulation code format consisting of arbitrary data patterns.

FIG. 2B is a digital waveform diagram of the binary data derived from the waveform diagram of FIG. 2A.

FIG. 3 is a block diagram of a data detection and synchronization circuit according to the preferred embodiment of the present invention.

DESCRIPTION OF THE PREFERRED EMBODIMENT

Figure 4:
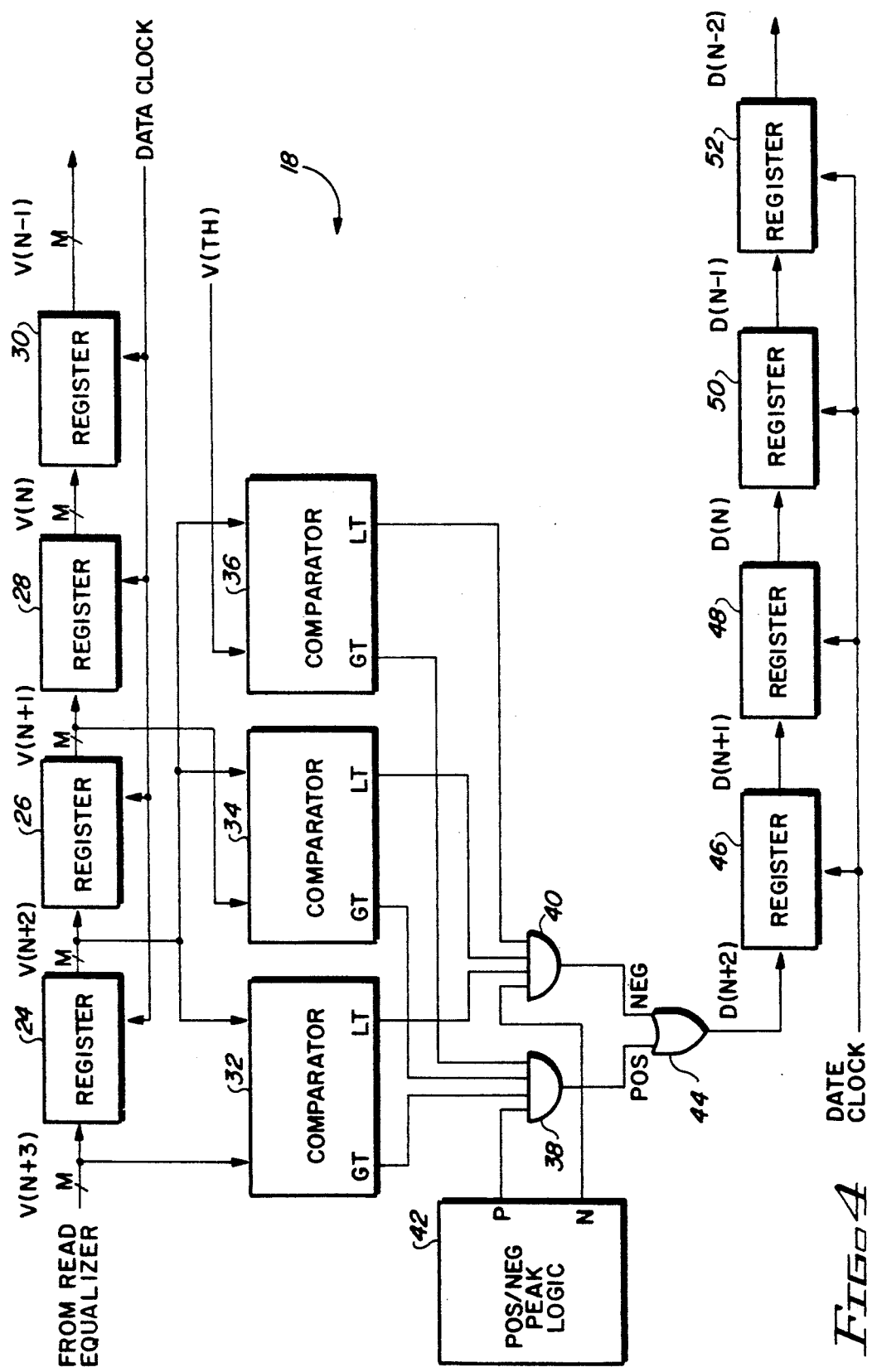
FIG. 4 is a logic diagram of a detector circuit according to the present invention.

The basic method of synchronizing a data clock to data read from a storage medium requires sampling the data being read at predetermined intervals of the data clock. A convenient predetermined interval would be, for example, at the center of the expected peaks such that each peak would be sampled at its known maximum magnitude. If the sample taken is determined to be nearly equal to a peak, and hence representing a binary 1, a phase error would exist since the peak was not at its known maximum magnitude. However, the sample may have occurred just prior to or just after the peak's center. While the magnitude of the phase error could be estimated, the polarity could not. Determining the polarity of the phase error can be accomplished by taking two samples, one on each side of the detected peak.

Referring now to FIG. 1A, a synchronization burst 2 is shown having a (1,1) modulation code format. The synchronization burst 2, because of its predictability, is very useful for synchronizing a data clock to data being read from a moving storage medium, for example, magnetic tape. The resulting binary data decoded from the synchronization burst 2 is shown in FIG. 1B as waveform 4. In the synchronization burst 2, the ideal expected voltages at times $N-1$ and $N+1$ are 0 volts each. Also, the ideal expected voltage of a peak would be $+/-2A$, wherein A represents a constant. Taking samples of the synchronization burst 2 at times $N-1$, $N+1$, and the value of the detected data at time N ($-1$, 0, $+1$), provides the information necessary to make an accurate estimation of the magnitude and polarity of the phase error using a Stochastic-Gradient algorithm (S-G).

The S-G algorithm is defined by an equation 1:

$$(V_{N-1} - V_{N+1}) * D_N \quad (1)$$

wherein $V_{N-1}$ and $V_{N+1}$ are the sampled voltage magnitudes at times $N-1$ and $N+1$, respectively, and $D_N$ is the detected data at time N having possible values of $-1$, 0, or $+1$ such that the existence and polarity of a peak is indicated. A slope factor of the synchronization burst is assumed to be unity and is thus not present in equation 1. Thus, when the data is zero, no phase error correction is made. If the data clock leads the synchronization burst a negative phase error will exist as illustrated by the following example. A negative phase error indicates the synchronization burst 2 has been sampled too early. For a detected positive peak ($D_N = +1$), the sample $V_{N-1}$ will have a negative value, and the sample $V_{N+1}$ will have a positive value. Assuming values of $-0.1$ volts and $+0.1$ volts for $V_{N-1}$ and $V_{N+1}$, respectively, and a detected positive peak, the S-G algorithm provides:

$$(-0.1 - 0.1) * +1 = -0.2.$$

Similarly, for a detected negative peak, assuming the sample of the synchronization burst 2 has been taken too early, then $V_{N-1}$ would be positive and $V_{N+1}$ would be negative. Assuming values of $+0.1$ volts and $-0.1$ volts for $V_{N-1}$ and $V_{N+1}$, respectively, the S-G algorithm provides:

$$(0.1 + 0.1) * -1 = -0.2.$$

The polarities of the above phase errors would be reversed in the cases where the data clock lags the synchronization burst 2.

The S-G algorithm accurately estimates a phase error when the slope between detected peaks is known. For the synchronization burst 2, the slope will always be the same since the waveform follows a known repetitive pattern (this assumes ideal conditions, i.e., that the slope for a rising edge is equal to a slope for a falling edge). Knowing the waveform slope is necessary for two reasons. First, the slope provides the time domain information that relates the magnitude of the phase error to the magnitude of the difference between the sampled voltage and the ideal expected voltage. That is, time can be calculated when the rate of voltage change per unit time (slope) is known. Second, knowing the slope provides the information necessary to determine what the ideal voltages at times $N-1$ and $N+1$ should be. While the slope will only have one value in the case of the (1,1) modulation code (ideally), the same is not true for other modulation codes, i.e., a (1,7) modulation code.

Referring now to FIG. 2A, arbitrary data encoded in a (1,7) modulation code format is shown by a waveform 6. The binary data encoded in the waveform 6 is shown by a waveform 8 in FIG. 2B. Two distinct slope factors are now possible in the waveform 6 (again, ignoring the difference between rising and falling edges). A slope, $K_1$, from the time $N-2$ to N is only one half the value of a slope, $K_2$, from time $N_1$ to $N_1+2$. The reason for the differences in slope factors $K_1$ and $K_2$ is because a peak at time N is proceeded by two binary ZEROS (see FIG. 2B), and a peak at time $N_1+2$ is proceeded by only one binary ZERO. The expected waveform 6 value at one time period just prior and just after a detected peak can no longer be assumed to be 0 volts as in the synchronization burst 2. Instead, the time periods just prior and just following a detected peak, as shown by the waveform 6, may have values of 0 volts or $+/-1A$ volts. Thus, an incorrect phase error estimation would result if the correct slope factor and the expected waveform magnitude are not used.

An incorrect phase error estimation result can be more clearly seen by the following example. If samples are taken at times $N_1-1$ and $N_1+1$, the expected values would be $-1A$ volts if the $K_1$ slope factor is assumed, or $-0$ volts if the $K_2$ slope factor is assumed. Assuming the data clock and the waveform 6 are exactly synchronized, then $-1A$ volts and 0 volts would be sampled at times $N_1-1$ and $N_1+1$, respectively. Using the S-G algorithm results in an estimated phase error equal to:

$$(-1A - 0) * -1 = 1A.$$

An erroneous result of 1A has been estimated instead of the true phase error of 0. The S-G algorithm, therefore, does not provide accurate results for arbitrary data such as is shown by the waveform 6. Correct slope factors, however, can be determined by including the value of the detected data at times $N_1-2$ and $N_1+2$.

The accurate estimation of a phase error in a data stream that is arbitrary, for example, in a (1,7) modulation code, is determined according to the present invention by determining a first error at time $N-1$ ($E(N-1)$) and a second error at time $N+1$ ($E(N+1)$). The expected magnitude of the voltage at time $N-1$ and the appropriate slope factor are determined by inspecting the data at time $N-2$ ($D(N-2)$). Similarly, the expected magnitude of the sampled signal at time $N+1$ and the appropriate slope factor are determined by inspecting the data at time $N+2$ ($D(N+2)$). Estimating the phase error is determined according to the relationship defined by an equation 2:

$$(E(N-1) + E(N+1)) * D(N), \quad (2)$$

wherein $D(N)$ equals 1 or 0 depending on whether a positive, negative or no pulse was detected at time N.

Estimating the errors $E(N-1)$ and $E(N+1)$ when a positive pulse is detected at time N can be more readily seen by applying equations 3-6:

$$E(N-1) = -K_1 * (1A - V(N-1)) \quad (3)$$
when $D(N-2) = 0$ $$E(N-1) = K_2 * V(N-1) \quad (4)$$
when $D(N-2) = 1$ $$E(N+1) = K_1 * (1A - V(N+1)) \quad (5)$$
when $D(N+2) = 0$ -continued $$E(N + 1) = -K_2 * V(N + 1) \quad (6)$$
when $D(N + 2) = 1$ Similarly, estimating the errors $E(N-1)$ and $E(N+1)$ when a negative pulse is detected at time N can be better understood by equations 7-10:

$$E(N - 1) = K_1 * (-1A - V(N - 1)) \quad (7)$$
when $D(N - 2) = 0$ $$E(N - 1) = -K_2 * V(N - 1) \quad (8)$$
when $D(N - 2) = 1$ $$E(N + 1) = -K_1 * (-1A - V(N + 1)) \quad (9)$$
when $D(N + 2) = 0$ $$E(N + 1) = K_2 * V(N + 1) \quad (10)$$
when $D(N + 2) = 1$ Inspection of equation 3-6 and 7-10 reveals that only the signs of the slope factors and the expected ideal voltage ($+/-1A$) change depending on whether a positive or a negative pulse was detected at time N.

FIG. 3 depicts a digital phase error estimator 11 having a read head 10, for example, a magnetic tape head for sensing a modulation code from a storage medium (not shown). The read head 10 is connected to an amplifier and Automatic Gain Control (AGC) circuit 12. The read head 10 provides a relatively weak modulation coded signal which is amplified by the amplifier and AGC circuit 12 to allow subsequent circuitry to properly operate on the modulation coded signal. The amplifier and AGC circuit 12 is connected to an analog to digital (A/D) converter 14 for providing an amplified modulation coded signal thereto. The A/D converter 14 converts the amplified modulation coded signal into a sequence of digital sample values. The number of bits making up the digital sampled values determines how accurately the digital samples represent the amplified modulation code. The A/D converter 14 is shown having an output made up of M bits for representing the amplified modulation coded signal. A six bit digital signal provides sixty four discrete values that can be represented and is typically sufficient for most applications. However, a more accurate digital modulation code can be provided by increasing the number of bits at the cost of a more complex A/D converter circuit 14. The trade offs between the choosing the number of bits in an A/D converter and increasing accuracy are well known to those skilled in the art.

The output of the A/D converter 14 is connected to an input of a read equalizer 16 for narrowing and shaping the sequence of digital sample values. The read equalizer 16 performs the equalization digitally. However, a read equalizer could instead be placed prior to the A/D converter 14 wherein the equalization would be performed in an analog manner. An M bit output of the read equalizer 16 is connected to an input of a detector 18 and to an input of a phase error estimator 20. The detector 18 has several functions, including: storing successive digital samples; determining whether any of the successive samples is a data pulse, and if so, whether the data pulse is negative or positive; and converting the successive samples into corresponding detected data bits.

The detector 18 is connected to the phase error estimator 20 for providing the successive samples and the data bits thereto. The phase error estimator 20 determines the phase difference between a data clock and the modulation code on each detected peak by providing a solution to the equations 3-10. Preferably, the detector 18 should be designed to have a small propagation delay since it is in a loop between the read equalizer 16 and the phase error estimator 20. The phase error estimator 20 accomplishes the estimation by performing the following functions: comparing the samples at times $N-1$ and $N+1$ to their respective expected values and determining the differences; polarity compensating the differences according to the polarity of the detected peak; multiplying the differences by an appropriate slope factor; and adding the slope corrected differences to provide the phase error estimate. The phase error estimator is connected to a clock circuit 22 such that the phase error estimate may be used by the clock circuit 22 to phase adjust the data clock with the modulation coded data. The clock circuit 22 is connected to the A/D converter 14 to complete the phase error loop.

FIG. 4 depicts the detector 18 in greater detail. Digital samples of the equalized signal are provided to the detector 18, from the read equalizer 16, on successive cycles of the data clock. The samples of the modulation code are stored in registers 24, 26, 28, and 30, respectively, on a first-in first-out (FIFO) basis, that is, the samples are stored successively. The data clock is connected to each register 24, 26, 28, and 30 for providing the necessary timing. The register 24 is connected to the read equalizer 16 for receiving each M bit sample of the equalized signal. The register 26 is connected to the registers 24 and 28 such that on each clock cycle the contents of the register 24 is transferred to the register 26, and the contents of the register 26 is transferred to the register 28. Similarly, the register 30 is connected to the register 28 such that on each clock cycle the contents of the register 28 are transferred to the register 30 and the contents of the register 30 are cleared out. Also, each register 24, 26, 28, and 30 is comprised of M memory elements, for example, 6 latches, for storing each of the 6 bits of each sample.

A determination of whether a peak has been stored in the register 24 is made by comparator circuits 32, 34, and 36. When the determination of whether any of the stored samples is a peak is being made, there are three samples of interest to the comparators 32, 34, and 36. Those three samples include $V_{N+1}$, $V_N$, and $V_{N-1}$. Assuming a peak is stored in the register 24, i.e., $V_N$, then it follows that the sample stored in the register 26 is $V_{N-1}$, and the sample available at the register 24 input is $V_{N+1}$. A first input of the comparator 32 is connected to the output of the read equalizer 16, a first input of the comparator 34 is connected to the output of the register 26, and a first input of the comparator 36 is connected to receive a threshold voltage $V_{th}$. The threshold voltage is used as a reference such that if a sample's magnitude exceeds the magnitude of the threshold voltage and the samples at the time period and the time period after, then a peak is detected. A second input of each comparator 32, 34, and 36 is connected to the output of the register 24. Therefore where $V_N$ is stored in register 24, $V_N$ is simultaneously and separately compared against $V_{N+1}$, $V_{N-1}$, and $V_{th}$.

Continuing with the present example, assuming that a positive peak is stored in the register 24, i.e., $V_N$, then a greater than (GT) output of each comparator 32, 34, and 36 will be a logical 1. These results can be better understood by referring back to FIG. 2A wherein at time N, the magnitude of the modulation coded data at time N is greater than its magnitude at times N−1 and N+1. On the next clock cycle, $V_N$ is shifted into the register 26, $V_{N+1}$ is shifted into the register 24, and $V_{N+2}$ is available at the first input of the comparator 32. This time the comparator 32 provides a GT result, but the comparator 34 provides a less than (LT) result, and comparator 36 provides a GT, EQ or LT result depending on whether $V_{N+1}$ is greater then, equal to or less than $V_{th}$. Thus a logical ZERO would be detected for time N+1. If a negative peak was stored as $V_N$ in the register 24, then each less than (LT) output of the comparators 32, 34, and 36 would be logical 1's.

Each GT output of the comparators 32, 34, and 36 is connected to an input of a AND gate 38. Each LT output of the comparators 32, 34, and 36 is connected to an input of a AND gate 40. A POS/NEG peak logic circuit 42 has a P output connected to an input of the AND gate 38, and an N output connected to an input of the AND gate 40. The POS/NEG peak logic circuit 42 operates like a latch such that the P and N outputs alternate wherein one output is a logical 1 while the other output is a logical 0 and they flip back and forth each time a peak is detected. Hence the POS/NEG peak logic circuit 42 enables the AND gate 38 after a negative peak has been detected and enables the AND gate 40 after a positive peak has been detected. If a positive peak is detected, the output of the AND gate 38 will be a logical 1, and if a negative peak has been detected, the output of the AND gate 40 will be a logical 1. If no peak is detected the outputs of the AND gates 38 and 40 will both be logical 0's.

The outputs of the AND gates 38 and 40 are connected to inputs of an OR gate 44. The output of the OR gate 44 is connected to an input of a register 46. Registers 46, 48, 50, and 52 are connected serially, each being connected to the data clock so that data bits are stored in a FIFO order. Each register 46, 48, 50, and 52 require only one memory element since it is only necessary to store one bit to represent the data. The OR gate 44 outputs a data bit corresponding to each sample of the modulation code. The data bits stored in the registers 46, 48, 50 and 52, lag, by one clock cycle, the digital samples stored in the registers 24, 26, 28, and 30, respectively. That is, when $V_N$ is stored in the register 24, $D_{N-1}$ is stored in the register 46.

Figure 5:
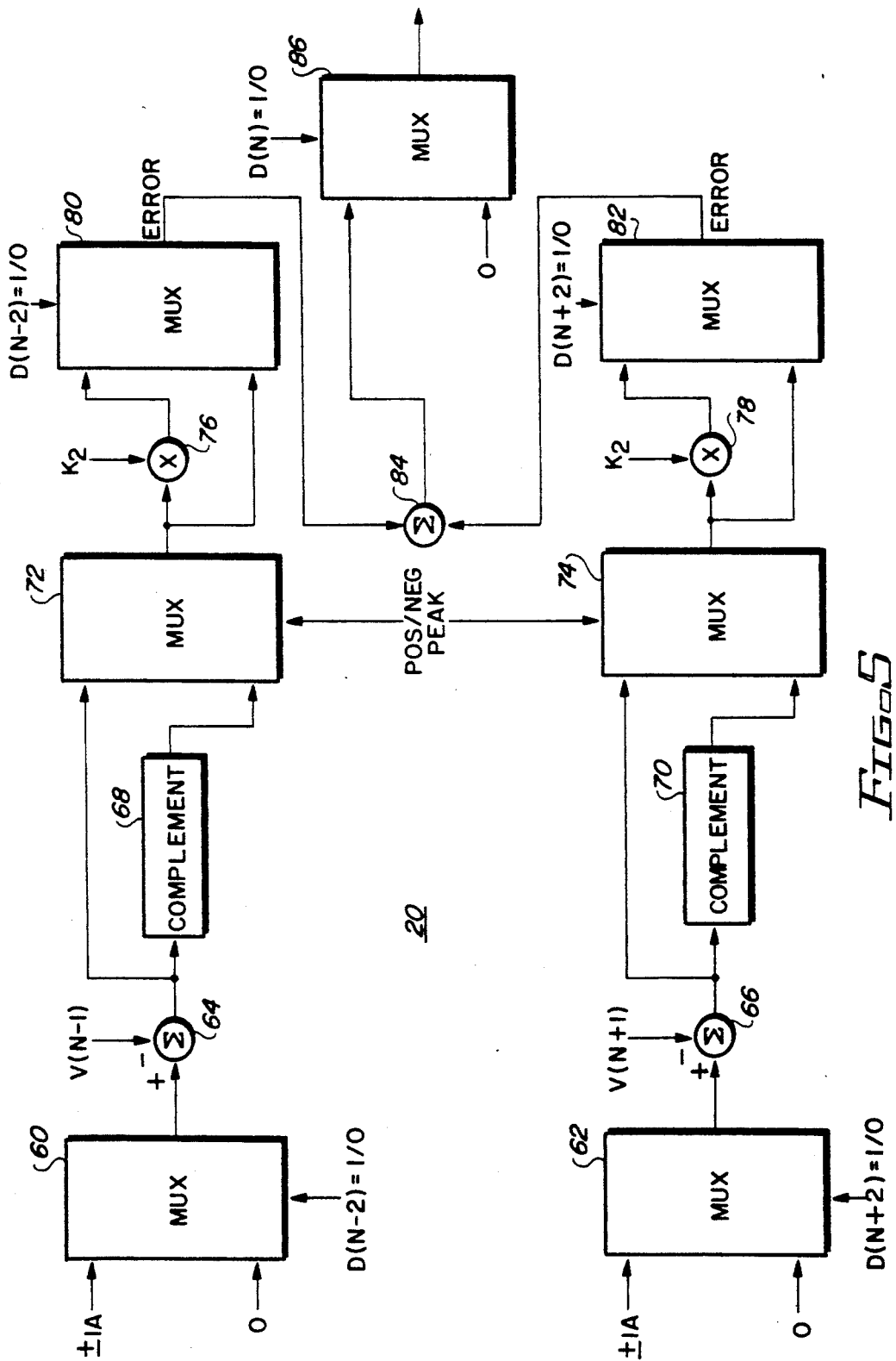
FIG. 5 is a logic diagram of a phase error estimator according to the present invention.

FIG. 5 shows a logical implementation of the phase error estimator 20. The phase error estimator 20 analyzes the samples and the data provided by the detector circuit on each clock cycle. If a peak has not been detected, the phase error estimation is ignored. If a peak had been detected, then the resulting phase error estimation is provided to the clock circuit 22 so that a synchronization correction can be made. Furthermore, the phase error estimator 20 makes an estimation of the phase error attributable to $V_{N-1}$, and the phase error attributable to $V_{N+1}$, simultaneously.

Two multiplexers 60 and 62 have the ideal expected values (0, 1A, or −1A volts) for times N−1 and N+1 connected to their multiplexed inputs. If the P output of the POS/NEG latch is positive, then the +1A value is closer. Likewise if the N output is positive then the −1A value is used. The control input of the multiplexer 60 is connected to the register 52 for receiving the $D_{N-2}$ signal (relative to a detected peak at time N). The control input of the multiplexer 62 is connected to the output of the OR gate 44 for receiving the $D_{N+2}$ signal (relative to a detected peak at time N). The purpose of the multiplexers 60 and 62 is to allow the data bits at times N−2 and N+2, respectively, to predict and provide the expected ideal values of the modulation coded signal at times N−1 and N+1, respectively (see equations 3-10).

If the data signal at the control input of either multiplexer 60 or 62 is a logical 0, then an output of that multiplexer would equal the +/− 1A ideal value. Whether 1A or −1A volts is made available at the inputs of the multiplexers 60 and 62, and hence at their outputs, depends upon whether a negative or positive peak was detected. If the data signal at the control inputs of either multiplexer 60 or 62 is a logical 1, then 0 volts would appear at the respective output. Of course, one of the multiplexers 60 or 62 could have a logical 1 at its control input while the other has a logical 0 at its control input. These results may be more readily understood by inspecting FIG. 2A and observing the possible relationships of the magnitudes of the modulation coded signal at times N−1 and N+1 in the absence or presence of a neighboring peak at times N−2 or N+2.

The output of the multiplexer 60, providing the expected value of the modulation code at time N−1, is connected to a summing circuit 64. An output of the register 30 is also connected to the summing circuit 64 for supplying the sample $V_{N-1}$ of the modulation coded signal. The difference between the expected value of the modulation coded signal and the sample, at time N−1, is provided at an output of the summing circuit 64. Similarly, the output of the multiplexer 62, providing the expected value of the modulation coded signal at time N+1, is connected to a summing circuit 66. An output of the register 26 is also connected to the summing circuit for providing the sample $V_{N+1}$ of the modulation coded signal. The output of the summing circuit 66 is the difference between the expected value and the sample of the modulation coded signal at time N+1.

The output of the summing circuit 64 is connected to an input of a complementing circuit 68 and to a first input of a multiplexer 72. An output of the complementing circuit 68 is connected to a second input of the multiplexer 72. Similarly, the output of the summing circuit 66 is connected to an input of a complementing circuit 70 and to a first input of a multiplexer 74. An output of the complementing circuit 70 is connected to a second input of the multiplexer 74. A control input of each multiplexer 72 and 74 is connected to the output of the POS/NEG peak logic circuit 42 for receiving the P signal (either the P, the N or both signals could be used). If a positive peak had been detected such that the P signal is a logical 1, the uncomplemented signals from the summing circuits 64 and 66, will appear at an output of each or the multiplexers 72 and 74, respectively. Alternatively, had a negative peak been detected, the P signal would be a logical 0 and the complemented signals from the complementing circuits 68 and 70 would appear at the outputs of the multiplexers 72 and 74 respectively. Hence, the outputs of the multiplexers 72 and 74 represent the polarity adjusted voltage errors at times N−1 and N+1, respectively.

The output of the multiplexer 72 is connected to an input of a multiplier 76 and to a first input of a multiplexer 80. An output of the multiplier 76 is connected to a second input of the multiplexer 80. Similarly, the output of the multiplexer 74 is connected to an input of a multiplier 78 and to a first input of a multiplexer 82. An output of the multiplier 78 is connected to a second input of the multiplexer 82. The slope factor $K_2$ is connected to the multipliers 76 and 78 such that the polarity adjusted voltage errors at times $N-1$ and $N+1$ are each multiplied by $K_2$ and are available at the second inputs of the multiplexers 80 and 82, respectively. The signals at the first inputs of the multiplexers 80 and 82 are equivalent to the polarity adjusted voltage errors multiplied by $K_1$, wherein $K_1$ is, without loss of generality, taken to be equal to 1. The the register 52 output (signal $D_{N-2}$ relative to a detected peak) is connected to a control input of the multiplexer 80 and the OR gate 44 output (signal $D_{N+2}$ relative to a detected peak) is connected to a control input of the multiplexer 82. Thus if a peak was detected at time $N-2$ or $N+2$ the output of the corresponding multiplexer 80 or 82 will be the signal multiplied by $K_2$. If no peak was detected at time $N-2$ or $N+2$, the output of the corresponding multiplexers 80 and 82 will be the input signal multiplied by $K_1$.

The output of the multiplexer 80 provides error $E(N-1)$ as defined by equations 3, 4, 7, and 8. Likewise, the output of the multiplexer 82 provides error $E(N+1)$ as defined by equations 5, 6, 9, and 10. The outputs of the multiplexers 80 and 82 are connected to inputs of a summing circuit 84, the phase error estimate, $E(N)$, being provided therefrom. The output of the summing circuit 84 is connected to a first input of a multiplexer 86 with a logical 0 signal being connected to a second input of the multiplexer 86. Register 48 is connected to a control input of the multiplexer 86 such that when a peak is detected, D(N) will be a logical 1 and the phase error estimate is made available at an output of the multiplexer 86. The logical 0 signal prevents any phase error update at the output of the multiplexer 86 whenever D(N) equals 0 (i.e., no peak has been detected).

While the invention has been particularly described with reference to particular embodiments thereof, it will be understood by those skilled in the art that various other changes in detail may be made therein without departing from the spirit, scope, and teaching of the invention. The preferred embodiment of the present invention has been described in terms of an A/D converter followed by a digital detector, but it can be appreciated that an analog detector implementation may be substituted. The invention has been described as correcting phase errors between modulated data read from a storage medium and a clock, but the present invention should not be construed to be limited to this application. The present invention, for example, is also applicable to digital communication channels such as modulation coded bipolar signaling as used in telephone applications. Here, a logical 0 is represented by an absence of a pulse and logical 1's are represented by alternating pulse polarities p(t) and −p(t).

What is claimed is:

1. A method of synchronizing data read from a storage medium to a clock signal by estimating any error in phase therebetween and correcting the estimated phase error, the data read being (l,k) modulation coded, the method comprising the steps of:
    detecting a peak;
    determining a polarity of the detected peak;
    storing a first detected data value taken two time periods prior to the detected peak;
    predicting a first expected signal amplitude at one time period prior to the detected peak based on the first data value and the detected peak polarity;
    storing a first signal amplitude sample taken one time period prior to the detected peak;
    determining a first slope factor based on the first detected data value;
    estimating a first phase error by multiplying the first slope factor by a difference between the first predicted signal amplitude and the first signal amplitude sample taken;
    storing a second detected data value taken at two time periods following the detected peak;
    predicting a second expected signal amplitude at one time period following the detected peak based on the second detected data value and the polarity of the detected peak;
    storing a second signal amplitude sample taken one time period following the detected peak;
    determining a second slope factor based on the second detected data value;
    estimating a second phase error by multiplying the second slope factor by a difference between the second signal amplitude prediction and the second signal amplitude sample; and
    adjusting the clock as a function of the first and second phase errors.

2. The method according to claim 1 wherein the detected peak and the first and second data samples are analog signals.

3. The method according to claim 2 further comprising the step of converting the detected peak, and the first and second samples to their digital equivalents.

4. The method according to claim 2 further comprising the step of equalizing the detected peak and the first and second data samples.

5. The method according to claim 3 further comprising the step of equalizing the digital equivalents of the detected peak and the first and second data samples.

6. The method according to claim 5 wherein the first and second slope factors are further adjusted according to whether the respective slope is a rising or falling slope.

7. The method according to claim 6 wherein the sum of the first and second phase errors are used to adjust the clock.

8. An apparatus for estimating a phase error between data pulses and a data clock wherein the data pulses are modulation coded such that each data pulse is followed by at least a single logical 0 and alternating data pulses have opposite polarities, the modulation coded data being synchronized to the data clock, said apparatus comprising:
    detector means for receiving samples of the modulation coded data and detecting a first data pulse therefrom by comparing each sample of the modulation code to a predetermined voltage, the polarity of the first detected data pulse being determined by the polarity of a previously detected data pulse of the modulation coded data and being a function of four other samples of the modulation code, a first sample taken two time periods before the first detected data pulse, a second sample taken one time period before the first detected data pulse, a third sample taken one time period after the first detected data pulse, and a fourth sample taken two time periods after the first detected data pulse; and
    phase error estimator means coupled to said detector means for determining a phase error existing between the first detected data pulse and the data clock by summing a first estimated error to a second estimated error, the first estimated error being determined by calculating a difference between a first expected voltage of the modulation coded data at one time period before the detected data pulse and the second sample, the first estimated error being polarity compensated to match the polarity of the detected peak and further being multiplied by a first slope factor, the first slope factor being a function of the data detected two time periods before the detected data pulse, and the second estimated error being determined by calculating a difference between a second expected voltage of the modulation coded data at one time period after the detected data pulse and the third sample, the second estimated error being polarity compensated to match the polarity of the first detected data pulse and further being multiplied by a second slope factor, the second slope factor being a function of the data detected two time periods after the detected data pulse.

9. The apparatus according to claim 8 wherein each sample is referenced to the data clock.

10. The apparatus according to claim 9 further comprising an analog to digital converter coupled to the detector means for receiving the modulation coded data and providing the samples of the modulation coded data to said detector means.

11. The apparatus according to claim 10 wherein each sample of the modulation code is represented by at least five bits.

12. The apparatus according to claim 11 further comprising an equalizer coupled to said analog to digital converter.

13. The apparatus according to claim 10 further comprising a magnetic tape head for reading the modulation coded data from a magnetic tape, an output of the magnetic tape head coupled to said equalizer.

14. The apparatus according to claim 13 wherein said detector means further comprises a plurality of registers coupled to the data clock for successively storing the samples of the modulation coded data, each register further comprising a plurality of latches wherein there is one latch for each bit representing the samples of the modulation coded data.

15. The apparatus according to claim 14 wherein said detector means further comprises a plurality of comparators coupled to said plurality of registers for receiving the samples of the modulation coded data and detecting data pulses therefrom.

16. The apparatus according to claim 15 wherein said detector means further comprises a plurality of data latches coupled to the plurality of comparators for storing the detected binary data bits corresponding to each detected data pulse.

17. A digital phase error estimator for determining a phase error between a detected peak of a portion of modulation coded data and a data clock, the phase error being used to correct the synchronization between the data clock and the modulation coded data, said digital phase error estimator comprising:

an analog to digital converter adapted for receiving the modulation coded data and providing digitized samples of the modulation coded data, the digitized samples being a function of the data clock;

a detector circuit coupled to said analog to digital converter for receiving the digitized samples of the modulation coded data therefrom and converting the digitized samples into data bits such that there is a corresponding data bit for each digitized sample, the detector circuit further comprising:

first storage means for storing digitized samples of the modulation coded data successively;

comparator means coupled to said first storage means for determining whether any one of the stored successive digitized samples is a peak and converting each successive digitized sample into a data bit; and second storage means coupled to said comparator means for successively storing the data bits received therefrom, each successive data bit corresponding to each successive digitized sample; and a phase error estimator coupled to said detector circuit for receiving the stored successive digital samples and the stored successive data bits, said phase error estimator further comprising:

first summing means for determining a first difference between a first stored digitized sample taken two time periods prior to the detected peak and a first expected value of the magnitude of the modulation coded data one time period prior to the detected peak;

second summing means for determining a second difference between a second stored digitized sample taken two time periods after the detected peak and a second expected value of the modulation coded data one time period after the detected peak;

first complementary means coupled for adjusting the polarity of the first difference according to the polarity of the detected peak;

second complementary means coupled for adjusting the polarity of the second difference according to the polarity of the detected peak;

first multiplier means for multiplying the first adjusted difference by a first slope factor, the first slope factor being a function of a first data bit occurring two time periods prior to the detected peak;

second multiplier means for multiplying the second adjusted difference by a second slope factor, the second slope factor being a function of a second data bit occurring two time periods after the detected peak; and third summing means for adding the first and second multiplied differences for providing an estimated phase error.

18. The digital phase error estimator according to claim 17 further comprising an equalizer circuit coupled to said digital to analog converter.

19. The digital phase error estimator according to claim 18 further comprising an amplifier coupled to said analog to digital converter.

20. The digital phase error estimator according to claim 19 further comprising a read head coupled to said amplifier.

* * * * *